United States Patent [19]

Kurata et al.

[11] 4,000,716
[45] Jan. 4, 1977

[54] EPITAXIAL GROWTH DEVICE

[75] Inventors: Kazuhiro Kurata, Hachioji; Kozi Honma; Masahiko Ogirima, both of Tokyo; Yuichi Ono, Kokubungi; Yoshiteru Keikoin, Tokyo, all of Japan

[73] Assignees: Hitachi, Ltd.; Hitachi Electronics Co., Ltd., both of Japan

[22] Filed: Aug. 12, 1971

[21] Appl. No.: 171,250

[30] Foreign Application Priority Data

Aug. 12, 1970 Japan .................. 45-70073

[52] U.S. Cl. .................. 118/5; 23/273 R; 23/294 R; 118/49; 156/613; 156/614; 252/62.3 GA; 427/87

[51] Int. Cl.² .................. B05C 11/00; B01J 17/32; C23C 13/08

[58] Field of Search .......... 23/273 SP, 301 SP, 294; 118/48, 49, 49.1, 49.5, 5, 7, 8; 117/106; 156/610, 612, 613, 614; 427/87

[56] References Cited

UNITED STATES PATENTS

| | | | |
|---|---|---|---|
| 3,031,261 | 4/1962 | Vogel et al. | 23/294 |
| 3,268,297 | 8/1966 | Fischer | 23/273 |
| 3,394,390 | 7/1968 | Cheney | 117/106 A |
| 3,441,000 | 4/1969 | Burd et al. | 117/106 A |
| 3,519,399 | 7/1970 | Kyle | 23/294 |
| 3,633,537 | 1/1972 | Howe | 118/48 |
| 3,675,619 | 7/1972 | Burd | 118/48 |
| 3,690,290 | 9/1972 | Jarvela et al. | 118/48 |

Primary Examiner—Norman Yudkoff
Assistant Examiner—Barry I. Hollander
Attorney, Agent, or Firm—Craig & Antonelli

[57] ABSTRACT

A longitudinal epitaxial growth device for making a mixed crystal of $III_b$–$V_b$ group intermetallic compound semiconductor in which a means for inverting the reaction gas flow is disposed between the gallium source and the substrate, the height of the device is reduced, and the length of the gas mixing band is made sufficiently long.

17 Claims, 7 Drawing Figures

U.S. Patent  Jan. 4, 1977  Sheet 1 of 2  4,000,716
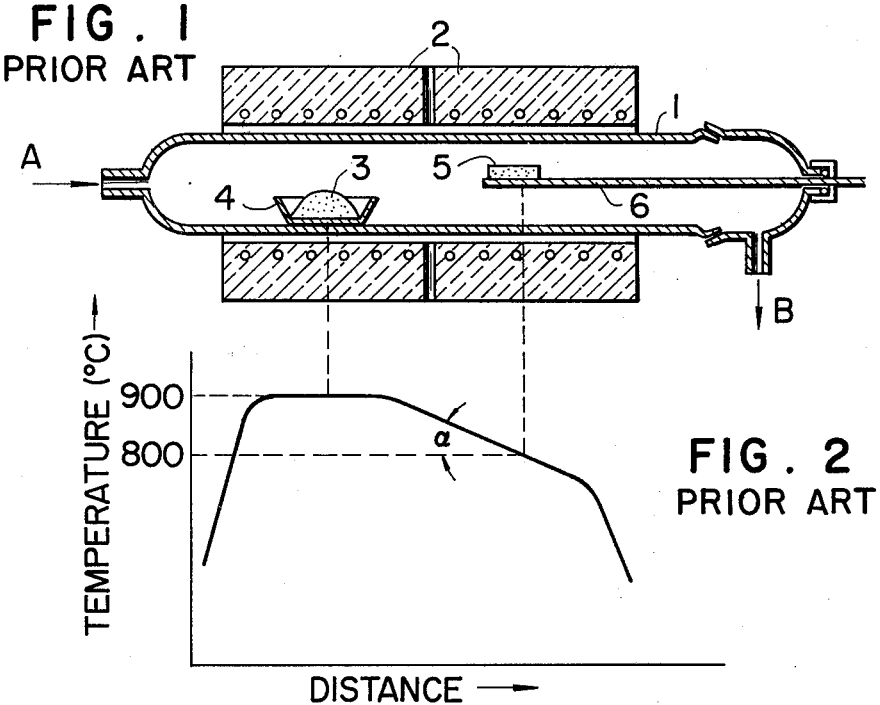
FIG. 1
PRIOR ART
FIG. 2
PRIOR ART
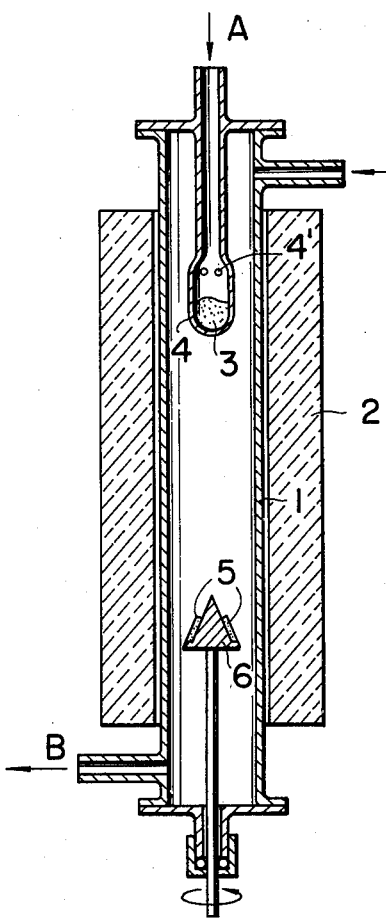
FIG. 3
PRIOR ART
INVENTORS
KAZUHIRO KURATA, KOZI HONMA,
MASAHIKO OGIRIMA, YUICHI ONO, YOSHITERU KEIKOIN
BY Craig, Antonelli & Hill
ATTORNEYS

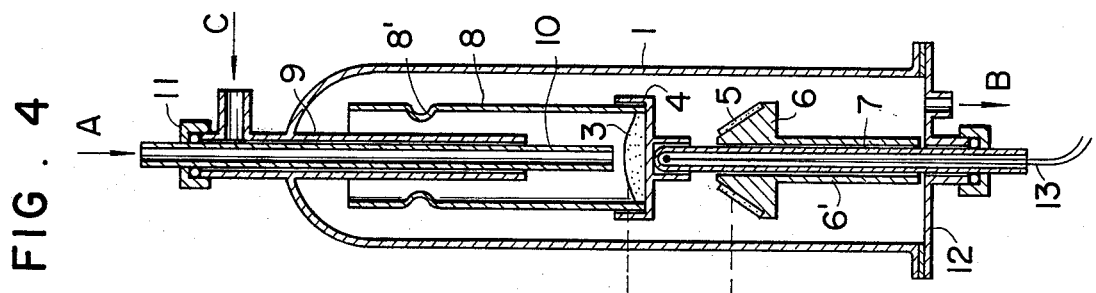
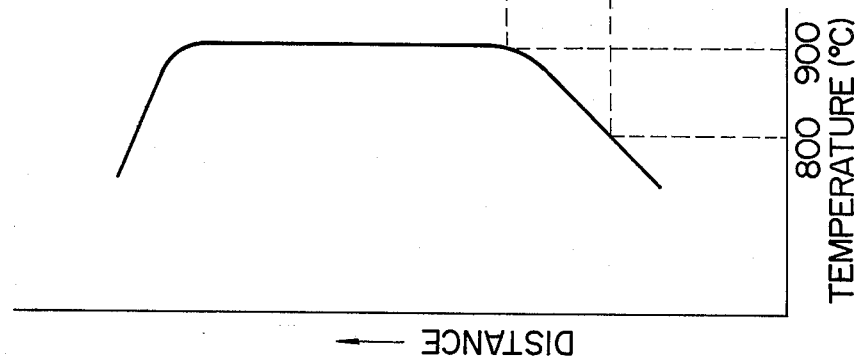
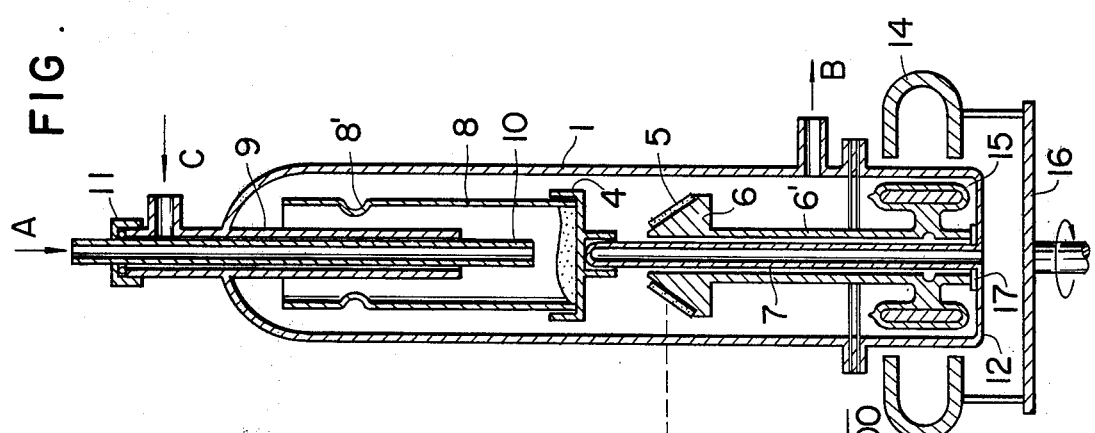
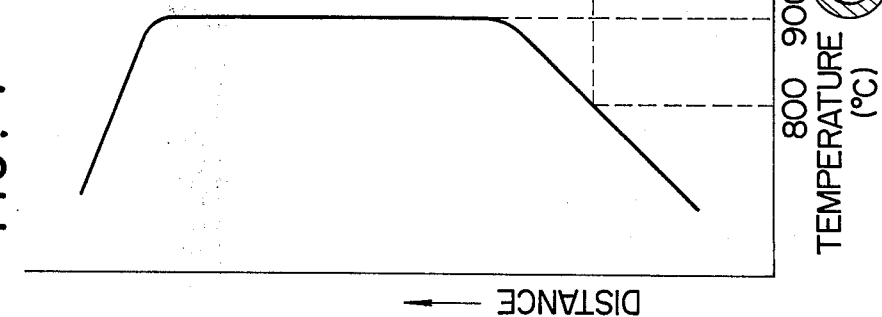
INVENTORS
KAZUHIRO KURATA, KOZI HONMA, YUICHI ONO,
MASAHIKO OGIRIMA, YOSHITERU KEIKOIN
BY Craig, Antonelli & Hill
ATTORNEYS

EPITAXIAL GROWTH DEVICE

This invention relates to a vapor epitaxial growth device for making a $III_b$–$V_b$ group intermetallic compound semiconductor such as GaAs and GaP or for making a mixed crystal of $III_b$–$V_b$ intermetallic compound semiconductor such as $GaAs_{1-x}P_x$.

The epitaxial growth devices as known in the art are of two types; the lateral epitaxial growth device and the longitudinal epitaxial growth device. The former type, which has generally been in use, is such that a reaction tube made of quartz is inserted nearly horizontally into a tubular electric oven, and a vessel which supports the material Ga and a substrate holder which holds the GaAs substrate crystal, are disposed in the reaction tube in the order of the reaction gas flow from the upstream to downstream and thereof.

Using this device, an epitaxial growth layer is formed in the following manner. The metal material Ga is placed on the vessel, and the GaAs substrate crystal on the substrate holder. The temperature inside the reaction tube is set through the electric oven so that the temperature of the metal support vessel is kept higher than that of the substrate holder. Then a mixed gas of $PCl_3$ and $AsH_3$, diluted by $H_2$, is supplied to the reaction tube whereby a mixed crystal of $GaAs_{1-x}P_x$ is formed epitaxially on the GaAs substrate crystal.

In this epitaxial growth process, the following considerations are important.

1. The distance between the material Ga and the substrate (i.e., the length of the gas mixing band) should be long enough for a thorough compositional and thermal mixture of the gases.

2. There should be a temperature gradient of about 10° to 20° C/cm in the low temperature area in which the substrate crystal is located.

In the lateral epitaxial growth device, it is relatively easy to maintain the gas mixing band to be sufficiently long, however, it is extremely difficult to dispose many substrate crystals at a time in the place where the temperature is constant because there should be a temperature gradient in the low temperature area where the substrate crystal is located. Even if a reaction tube with a large diameter is used and the substrate crystals are arranged in layers at specific intervals in the constant temperature area, uniform gas flow and temperature can hardly be maintained in the area where the substrate crystals are arranged and, as a result, it is hardly possible to obtain uniform thickness and crystal of the epitaxial layer formed on each substrate.

To solve the foregoing problems, the longitudinal epitaxial growth device has been developed. More particularly, the aim of this device is to dispose many substrate crystals at the same time in the reaction tube under the condition of uniform gas flow and temperature.

In the longitudinal epitaxial growth device, more than several pieces of substrate crystals are disposed radially around a pyramidal substrate holder and, therefore, it is possible to maintain the individual substrate crystals under the same condition of gas flow and temperature. In this type of epitaxial growth device, however, the diameter of the reaction tube must be considerably large so that many substrate crystals can be radially arranged. To this end, it is necessary to elongate the length of the gas mixing band. This requires the use of a considerably long reaction tube and electric oven, and it becomes difficult to insert the reaction tube into the electric oven in the axial direction. In the prior art, therefore, a split type electric oven is generally used for mounting the reaction tube in the lateral direction. The split type oven in general is undesirable in the uniformity of its temperature distribution, compared with the coiled oven having a heater wire coiled about its refractory tube. This is why the split type oven is not suited for application to the epitaxial growth device used on the mixed crystal or compound of the $III_b$–$V_b$ group.

The major aim of this invention is to solve the foregoing problems in the conventional epitaxial growth device. Thus, a general object of this invention is to provide a novel epitaxial growth device for making a $III_b$–$V_b$ group compound or a mixed crystal of $III_b$–$V_b$ group semiconductor in which the length of the reaction tube can be reduced, the coiled oven can be used, the gas mixing band can be made sufficiently long, and many pieces of substrate crystals can be disposed at a time in the reaction tube.

Other objects and advantages of this invention will be apparent from the following description when considered with the drawings in which:

FIG. 1 is a sectional view showing a reaction tube of the conventional lateral epitaxial growth device, FIG. 2 shows the temperature distribution in the reaction tube shown in FIG. 1, FIG. 3 is a sectional view showing a reaction tube of the conventional longitudinal epitaxial growth device, FIG. 4 is a sectional view showing a reaction tube of the epitaxial growth device of this invention.

FIG. 5 shows the temperature distribution in the reaction tube shown in FIG. 4,

FIG. 6 is a sectional view showing another reaction tube of the epitaxial growth device of this invention, and FIG. 7 shows the temperature distribution in the reaction tube shown in FIG. 6.

Referring to FIG. 1, there is shown in sectional view a conventional lateral epitaxial device wherein a reaction tube 1 made of quartz is inserted nearly horizontally in a tubular electric oven 2, and a vessel 4 which holds the metal material Ga 3 and a substrate holder 6 which holds a GaAs substrate crystal 5 are disposed in the manner as illustrated.

Using the lateral epitaxial growth device having the laterally disposed reaction tube 1, a compound semiconductor growth layer such as, for example, a $GaAs_{1-x}P_x$ growth layer is formed in the following manner. The temperature distribution in the reaction tube 1 is determined by the electric oven 2 so that the area where the vessel 4 is located, is kept at a high temperature (e.g., about 900° C) and the area where the substrate crystal holder 6 is located, is kept at a low temperature (e.g., about 800° C) as shown in FIG. 2. A mixture gas such as, for example, a $PCl_3$—$AsH_3$ gas diluted by $H_2$, is supplied to the reaction tube 1 from the left end (in the direction of arrow A). These gases are decomposed into $P_4$, $As_4$ and HCl gases in the relatively low temperature area before the high temperature area. The gases of the $V_b$ group elements $P_4$ and $As_4$ reaching the high temperature area of about 900° C are dissolved into the fused $Ga^3$, thereby saturating the Ga 3. The gases flow down further. The HCl gas produced by thermal decomposition of $PCl_3$ and $AsH_3$ reacts on the fused Ga 3 to produce a GaCl gas at a temperature of about 900° C. The GaCl gas also flows down, i.e., toward the right as viewed in FIG. 1. When these gases reach the low temperature area kept at about 800° C where the GaAs substrate crystal 5 is located, the so-called disproportionation reaction takes place whereby $GaCl_3$ and $GaAs_{1-x}P_x$ are produced. This mixed crystal $GaAs_{1-x}P_x$ is epitaxially grown on the substrate crystal 5. In FIG. 1, the arrow B indicates the direction of the gas exhaust.

As described above, this type of epitaxial device does not permit many substrate crystals to be placed in the area of constant temperature. This makes it difficult to obtain an epitaxial layer having a constant thickness and constant characteristics.

The longitudinal epitaxial growth device as shown in FIG. 3 has been developed to improve the lateral epitaxial growth device. According to the longitudinal epitaxial growth device, many substrate crystals can be disposed simultaneously in the reaction tube under the condition of uniform gas flow and temperature. More specifically, more than several pieces of substrate crystals 5 are disposed radially around a pyramidal substrate holder 6 and, hence, uniform gas flow and temperature can be maintained for the individual substrate crystals.

In FIG. 3, reference numeral 1 denotes a reaction tube made of quartz, reference numeral 2 a split type electric oven, reference numeral 3 a material Ga, and reference numeral 4 a vessel into which Ga is placed. The functions of these components are substantially the same as those of the lateral epitaxial growth device as in FIG. 1. In FIG. 3, the arrow A indicates the direction along which a gas such as $PCl_3$, $AsH_3$ or HCl is introduced into the reaction tube, and the arrow C the direction along which a carrier gas such as $H_2$, $N_2$ or A is supplied, and the arrow B the direction of the exhaust gases.

In such longitudinal epitaxial growth device, the diameter of the reaction tube 1 must be large enough so that many substrate crystals can be disposed in the radial form. In other words, the length of the gas mixing band, or the distance betwen the holes 4' of the vessel 4 and the area where the substrate crystals 5 are placed must be long enough. The length of the reaction tube and electric oven must also be long enough. As a result, it becomes difficult to insert the reaction tube 1 into the electric oven 2 in the axial direction. In the prior art, therefore, the split type electric oven is generally used to facilitate mounting the reaction tube in the lateral direction. The split type oven in general is inferrior in the uniformity of temperature distribution, compared with the coiled oven having a heater wire coiled about its refractory tube. This is why the split type oven is not suited for application to the epitaxial growth device used with the mixed crystal or compound of $III_b$–$V_b$ group.

Concrete examples of the device of this invention will be described below by referring to the drawings.

EXAMPLE 1

In FIG. 4, a crucible-shaped cylindrical Ga holder 4 containing a Ga 3 is disposed in the central area of a reaction tube 1 made of quartz. The Ga holder 4 is supported at its base by a quartz shaft 7. The lower part of the quartz shaft 7 is extended through a reaction tube cap 12 and is hermetically secured to this cap 12.

A quartz cylinder 8 whose outer diameter is slightly smaller than the inner diameter of the crucible-shaped Ga holder 4 is disposed vertically in the Ga holder 4. The quartz cylinder 8 contains a quartz tube 9 which is extended through the upper part of the reaction tube 1 and fused thereto. Another quartz tube 10 is inserted into the tube 9 as far as the area near the surface of the fused Ga. The tube 10 is hermetically secured to the outer wall of the tube 9 by a joint 11 outside the reaction tube 1.

Reference numeral 5 denotes a substrate crystal, and reference numeral 6 a pyramidal substrate crystal holder having a tubular support shaft 6'. The quartz shaft 7 extends through the central hole of the substrate crystal holder 6. The lower end of the quartz shaft 7 is supported by the reaction tube cap 12 of the flat shape and thus held in position.

A hollow 8' of the cylinder 8, for example, formed by four inward projections or indentations, serves to hold the cylinder 8 in the vertical position. Reference numeral 13 denotes a thermocouple which may be inserted into the quartz shaft 7 to measure the temperatures of the areas of Ga 3 and of the substrate crystal 5.

For example, the epitaxial growth of a mixed crystal of $GaAs_{1-x}P_x$ is carried out in the following manner: First, the temperature distribution in the reaction tube 1 is determined as indicated in FIG. 5. A gas such as, for example, $PCl_3$ or HCl diluted by $H_2$, $N_2$ or the like is introduced into the reaction tube by way of the upper part of the quartz tube 10 in the direction indicated by the arrow A. Similarly, a gas such as $AsH_3$ diluted by $H_2$, $N_2$ or the like, or a mixed gas such as $AsH_3$ and $PH_3$ is introduced thereinto by way of the upper part of the quartz tube 9 in the direction indicated by the arrow C.

The gas introduced into the area near the liquid level of the fused Ga 3 blows into the Ga 3 whereby GaCl, $P_4$, etc. are produced. These gases and the mixture gas of $As_4$, $P_4$, $H_2$, etc. which have been produced as a result of decomposition of the gas supplied by way of the quartz tube 9, are thoroughly mixed both compositionally and thermally during the process whereby these gases move up and down inside the cylinder 8, fall after being inverted at the upper end of the reaction tube 1, and reach the area of the substrate crystal 5 along the inner wall of the reaction tube 1.

According to the invention, therefore, the effective length of the gas mixing band can be made long even if the length of the reaction tube 1 is considerably reduced in comparison with that of the conventional longitudinal type epitaxial growth device. This makes it possible not only to obtain the desirable epitaxial growth but also to facilitate mounting the reaction tube 1 even on the coiled type electric oven whose temperature distribution characteristic is excellent.

When the coiled type oven is used, the substrate crystal holder is not necessarily rotated. However, if necessary, a rotating mechanism for rotating the substrate crystal holder may be used. This rotating mechanism, as described in the second example, can be easily mounted on the electric oven.

In the above embodiment, the effective length of the gas mixing band can be made long enough even if the full length of the reaction tube 1 is relatively short. In addition, the substrate crystal 5 and Ga 3 can be easily replaced by merely removing the reaction tube cap 12. For this replacement, the fall stroke of the cap 12, i.e., the distance of downward movement thereof can be short. Because the gap between the Ga holder 4 and the gas flow inverting cylinder 8 is sealed by the fused Ga 3, the gas does not leak from the cylinder 8 through this gap. Accordingly, there is no possiblity of reducing the effective length of the gas mixing band due to gas leakage. In the device of this embodiment, the number of joints such as fitting parts to the reaction tube 1 is smaller than that in the conventional longitudinal type device as shown in FIG. 3. Therefore the removal of the cap 12 will suffice for replacement of the Ga 3. This effectively serves to prevent dust from entering the reaction tube 1.

EXAMPLE 2

Referring to FIG. 6, there is shown the structure of a cap located at the lower end of the device, in which a sealed type substrate rotating mechanism comprising a magnet 14 and a quartz ampoule 15 containing a magnetic piece is mounted.

More specifically, a quartz shaft 7 is set up on the center of the cap 12 of the reaction tube 1 by welding. A substrate crystal holder 6 having a tubular support shaft 6' is rotatively disposed round the quartz shaft 7. The ampoule 15 in which an iron piece is enclosed under vacuum is mounted around the lower part of the support shaft 6' so that the ampoule 15 is located inside the cap 12. The ampoule 15 is rotated by the magnet 14 secured to the rotating disk 16 from the outside of the cap 12. Reference numeral 17 denotes a bearing of polyethylene fluoride or graphite disposed in the lower part of the support shaft 6' in order to rotate the shaft 6' smoothly.

According to this embodiment, it is possible to rotate the substrate crystal 5 without increasing the number of fitting joints to the reaction tube 1, compared with that in the structure as in Example 1. Thus the substrate crystal 5 can be treated under uniform temperature and gas flow condition, and the desirable epitaxial growth can be realized.

In summary, the advantages of this invention are as follows:

1. All the materials such as substrate crystal 5 and Ga 3 inserted into the device are minimally contaminated due to external dust because these materials can be inserted into the device from the lower part of the reaction tube 1.

2. The effective length of the mixing band can be made long even if the full length of the reaction tube 1 is short because the gas flow is inverted at the upper part of the reaction tube 1 by the cylinder 8 located at the upper part of the substrate crystal holder 4. Thus, the desirable epitaxial growth can be obtained. Furthermore, the reaction tube can easily be mounted on the electric oven even if the electric oven is of coiled type whose temperature distribution characteristic is excellent.

3. The Ga 3 can be readily dismounted and carried off for the intended purposes because the lower part of the gas flow inverting cylinder 8 is sealed by the Ga 3 inside the Ga holder 4. In addition, a tight seal can be obtained against gas leakage in this structure.

4. By using the shaft 7 as the center shaft, a substrate rotating mechanism of magnetic coupling type can easily be mounted on the cap without the need of using a larger number of fitting joints to the reaction tube than in the non-rotating type mechanism.

While we have shown and described only two embodiments in accordance with the present invention, it is understood that it is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. An epitaxial growth device for making either a IIIb–Vb group compound semiconductor or a mixed crystal semiconductor of Group IIIb–Vb, comprising:
    a substantially vertically supported reaction tube;
    a crucible-shaped cylindrical metal holder disposed in said reaction tube and having a vertical axial length extending in said reaction tube;
    means for maintaining a substantially isothermal temperature distribution in said reaction tube along the vertical axial extension of said cylindrical metal holder, wherein metal contained in a lower portion of said metal holder is in a fused condition, and for establishing a temperature gradient from approximately the lower portion of said metal holder to a lower portion of said reaction tube;
    gas guide tube means inserted from an upper part of said reaction tube and extending inside said cylindrical metal holder to near the metal contained by said holder for introducing all reaction gases adjacent to the metal, said cylindrical metal holder providing a reaction zone and a mixing zone for all the reaction gases such that the reaction gases are mixed in the isothermal portion of the reaction tube inside said cylindrical metal holder, wherein said cylinder and guide tube means are coextensive with one another over a substantial part of the axial length of the reaction tube; and
    wherein said substantial part approximates at least one half of the axial length of the reaction tube;
    substrate crystal holder means disposed below said cylindrical metal holder in said lower portion of said reaction tube; and
    means for causing gas to flow past said crystal holder means, whereby the mixed reaction gases subsequently pass over a top portion of said cylindrical metal holder down to said crystal holder means.

2. An epitaxial growth device in accordance with claim 1, further comprising magnet means located outside said reaction tube and secured to a tubular support shaft; and means for rotating said holder by magnetic coupling with said magnet means disposed outside said reaction tube.

3. An epitaxial growth device according to claim 1, wherein the cylindrical metal holder includes a crucible metal holder and gas flow inverting cylinder means disposed inside said crucible metal holder and having a vertical axial length slightly shorter than said isothermal distribution distance.

4. An epitaxial growth device according to claim 1, wherein said reaction tube includes a cap means at its lower end.

5. An epitaxial growth device according to claim 1, wherein said cylindrical metal holder is supported by a support shaft, extending to the lower portion of said reaction tube and supporting said crystal holder.

6. An epitaxial growth device according to claim 5, wherein said cylindrical metal holder and said crystal holder means are supported by a support shaft connected to said cap means.

7. An epitaxial growth device according to claim 1, wherein said means for maintaining an isothermal temperature distribution and for establishing a temperature gradient includes a coiled type electric oven.

8. An epitaxial growth device according to claim 1, wherein said crystal holder is disposed slightly below said cylindrical metal holder, whereby the reaction tube is short.

9. An epitaxial growth device according to claim 1, wherein the vertical axial length of said cylindrical metal holder in the isothermal region defines the gas mixing zone, whereby reaction gases are compositionally and thermally mixed.

10. An epitaxial growth device according to claim 1, wherein said crystal holder means is substantially pyramidal-shaped for holding a plurality of substrate crystals.

11. An epitaxial growth device according to claim 1, wherein said means for causing gas to flow past said crystal holder means includes a discharge means disposed below said crystal holder means.

12. An epitaxial growth device according to claim 6, wherein said support shaft is effectively connected to said cap means inside the reaction tube.

13. An epitaxial growth device according to claim 1, further comprising means magnetically rotating said holder from the outside of said reaction tube.

14. An epitaxial growth device according to claim 4, further comprising means detachably connecting said cap means to the lower part of the reaction tube to enable insertion and removal of the metal and crystals partaking in the epitaxial growth.

15. An epitaxial growth device according to claim 14, wherein a support shaft is effectively connected to said cap means inside the reaction tube.

16. An epitaxial growth device according to claim 15, wherein said cylinder and guide tube means are coextensive with one another over a substantial part of the axial length of the reaction tube.

17. An epitaxial growth device according to claim 16, further comprising means magnetically rotating said holder from the outside of said reaction tube.

* * * * *